United States Patent [19]
Moats

[11] Patent Number: 4,465,988
[45] Date of Patent: Aug. 14, 1984

[54] SLOW WAVE CIRCUIT WITH SHAPED DIELECTRIC SUBSTRATE

[75] Inventor: Robert R. Moats, Mt. Prospect, Ill.

[73] Assignee: The United States of America as represented by the Secretary of the Air Force, Washington, D.C.

[21] Appl. No.: 441,816

[22] Filed: Nov. 15, 1982

[51] Int. Cl.³ ............... H01P 9/00; H01P 11/00; H01J 25/36; H01J 23/24
[52] U.S. Cl. .................... 333/156; 29/600; 315/3.5; 333/161
[58] Field of Search ............ 333/156, 161, 162, 238; 315/3.5, 3.6, 39.3, 39.4; 330/4.6, 4.7; 29/600

[56] References Cited
U.S. PATENT DOCUMENTS

| | | | |
|---|---|---|---|
| 3,504,222 | 3/1970 | Fukushima | 333/156 X |
| 3,610,998 | 10/1971 | Falce et al. | 29/600 X |
| 3,702,413 | 11/1972 | Glance | 315/3.5 |
| 3,778,643 | 12/1973 | Jaffe | 333/161 X |
| 3,904,994 | 9/1975 | Bates et al. | 333/161 |
| 3,925,738 | 12/1975 | Bates et al. | 333/161 |
| 4,074,211 | 2/1978 | Bates | 333/161 |

*Primary Examiner*—Marvin L. Nussbaum
*Attorney, Agent, or Firm*—Donald J. Singer; Bernard E. Franz

[57] ABSTRACT

The substrate is ladder shaped and is located between a serpentine metallic meander line conductor and a metallic ground plane. Conductive shields are disposed in slot-like openings of the substrate between adjacent parallel transverse segments of the meander line to decrease dispersion and increase the bandwidth to a full octave.

7 Claims, 8 Drawing Figures

Fig. 1

PRIOR ART

SLOW WAVE CIRCUIT WITH SHAPED DIELECTRIC SUBSTRATE

RIGHTS OF THE GOVERNMENT

The invention described herein may be manufactured and used by or for the Government of the United States for all governmental purposes without the payment of any royalty.

BACKGROUND OF THE INVENTION

This invention relates generally to microwave apparatus, and more particularly to a crossed field meander line slow-wave circuit device.

It has been determined in prior art crossed field meander line circuits, for example U.S. Pat. No. 3,904,994, entitled "Meander Line Circuit With An Interdigital Ground Plane", and U.S. Pat. No. 3,925,738, entitled "Rail or Pedestal Mounted Meander Line Circuit For Cross-Field Amplifiers", C. D. Bates et al that removal of the dielectric between meander line segments results in several advantages heretofore unavailable, namely, it eliminates the effects of sputtering which would otherwise act as a collection surface for sputtered metal, it eliminates extraneous RF dielectric loading of the RF wave formed by the meander line, and it reduces segment-to-segment capacitance of the metallic meander line which in turn reduces the dispersion and increases the bandwidth of the device. In the referenced patents there are shown meander line slow-wave circuit devices in which the dielectric support includes a raised surface portion which is shaped identically with the metallic conductor material disposed thereon. U.S. Pat. No. 3,925,738 in FIG. 4 shows conductive shielding vanes between segments of the meander line.

U.S. Pat. No. 4,074,211 entitled "Dielectric Substrate for Slow Wave Structure" by C. D. Bates is directed to meander line slow-wave circuitry consisting of a metallic ground plane, a dielectric substrate contigous with said ground plane, and a serpentine meander line conductor located on the dielectric substrate. The substrate is ladder shaped, having a plurality of regularly spaced transverse vane segments intersecting a pair of opposing longitudinal vane segments and upon which said meander line conductor is disposed whereupon certain portions of the vane segments are exposed while providing slot-like separations in the dielectric substrate between adjacent segments of the meander line conductor.

Advantages of the shaped-substrate circuit supported on individual bars are (1) the parts count is greatly reduced, thus reducing the cost of parts and of assembly; and (2) circuits for higher frequency are possible. When the circuit is supported on individual dielectric bars, the circuit dimensions are limited by the size of bars which are practical to manufacture and assemble.

SUMMARY OF THE INVENTION

It is an object of this invention to provide an improved meander line circuit device. A specific object is to provide a circuit suitable for instantaneous octave bandwidth in an injected beam crossed-field amplifier.

According to the invention, a slow-wave circuit, and more specifically a meander circuit, is supported on a shaped dielectric substrate; and incorporates shields between successive circuit elements to decrease dispersion and increase bandwidth.

DETAILED DESCRIPTION

Figure 1:
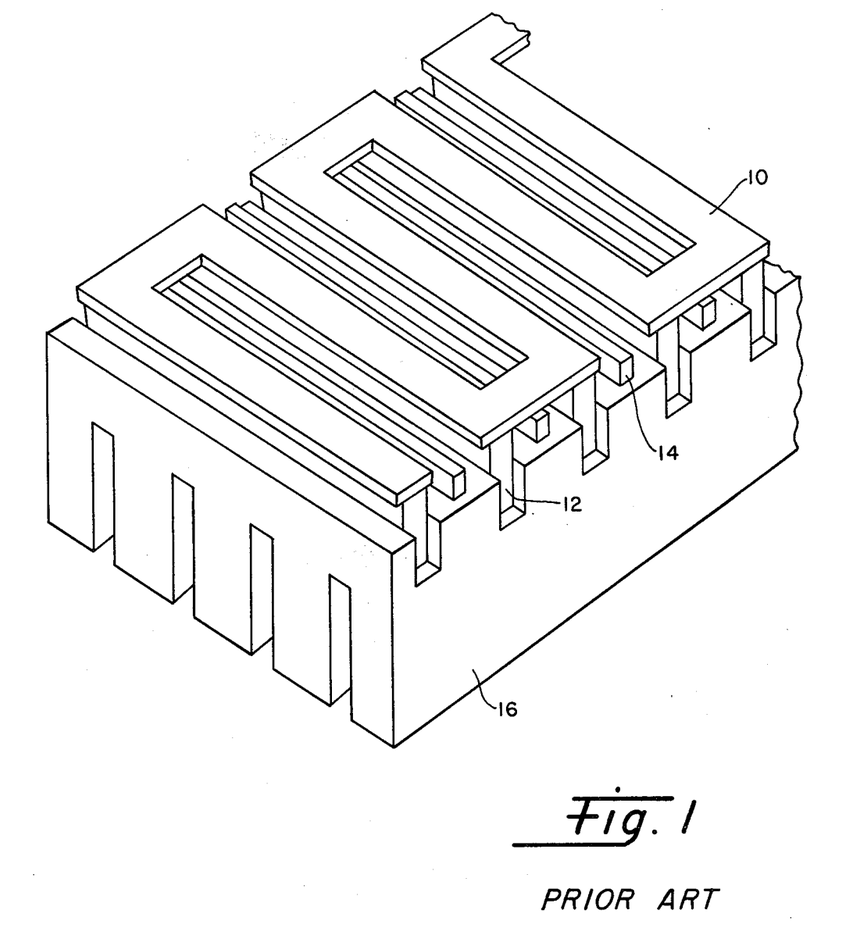
FIG. 1 is a perspective view of a prior art slow wave circuit with a meander line and shields.

Meander circuits with shields (or vanes) between successive circuit elements are already well established in the state of the art. See, for example, FIG. 4 of U.S. Pat. No. 3,925,738. An example of such a circuit is illustrated in FIG. 1. Here the copper meander circuit 10 is supported on individual dielectric bars 2 of beryllia ceramic, with interfinger vanes or shields 14. The structure is mounted on a copper ground plane 16 with coolant channels.

Figure 2:
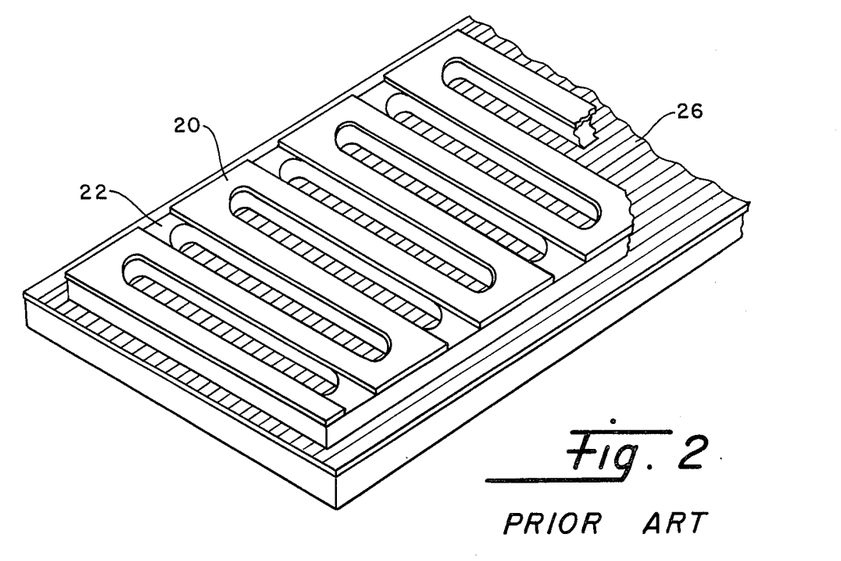
FIG. 2 is a perspective view of a prior art slow wave circuit with a meander line on a ladder-shaped substrate.

The shaped-substrate meander circuit overcomes some disadvantages of previously built meander circuits. The individual dielectric bars shown in FIG. 1 are replaced by a continuous substrate which is shaped into a ladder configuration by laser cutting or other means. The resulting meander circuit configuration is shown in FIG. 2 with meander line 20. It is necessary that the ladder-shaped dielectric substrate 22 be brazed or otherwise bonded to a copper ground plane 26 on a coexpansive base (i.e. the ground plane has the same coefficient of thermal expansion as the dielectric material). This kind of circuit is the subject of U.S. Pat. No. 4,074,211 which is hereby incorporated by reference. Such a circuit has been incorporated into a crossed-field amplifier with successful operation demonstrated.

The advantages of the shaped-substrate circuit over the circuit supported on individual bars are as follows:

(1) The parts count is greatly reduced, thus reducing the cost of parts and of assembly.

(2) Circuits for higher frequency are possible. When the circuit is supported on individual dielectric bars, the circuit dimensions are limited by the size of bars which are practical to manufacture and assemble.

Figure 3:
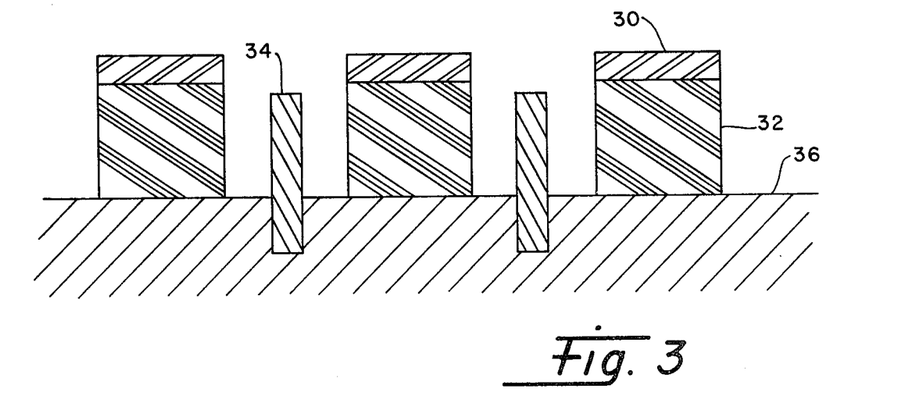
FIGS. 3 and 4 are a sectional view and a perspective view respectively of a slow-wave circuit according to the invention.
Figure 4:
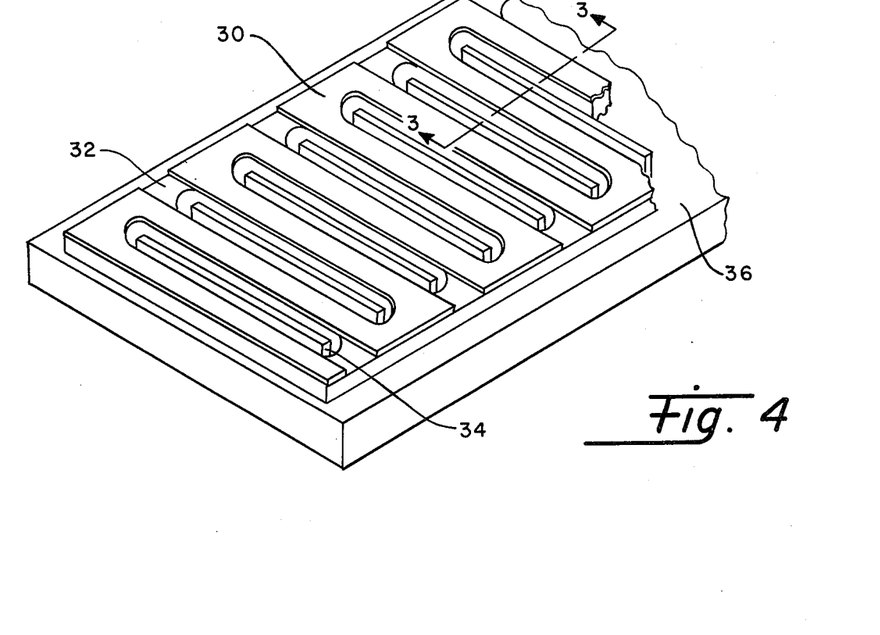

The invention described herein incorporates a shaped substrate to support a slow-wave circuit and also incorporates shields between bars. The configuration is shown in FIGS. 3 and 4. The construction sequence is as follows:

(1) A series of grooves is cut in the ground plane 36 in which the shields are to be inserted.

(2) The shields 34 are inserted and brazed in place.

(3) A final machine cut on the brazed assembly is performed to assure uniform and accurate effective size and position of vanes (4) The assembly is coated with a layer of copper by plating or sputtering to assure good surface conductivity.

(5) The substrate 32, previously cut to the ladder configuration by laser or other means, is brazed or otherwise bonded to the ground plane. The substrate is metallized all over on one face and is metallized in a meander configuration on the opposite face, to which the meander circuit is attached. The presently used bonding process consists of copper-to-copper diffusion without adding a braze filler material so that resistance losses are minimized.

(6) The meander circuit 30 is bonded to the substrate.

Figure 5:
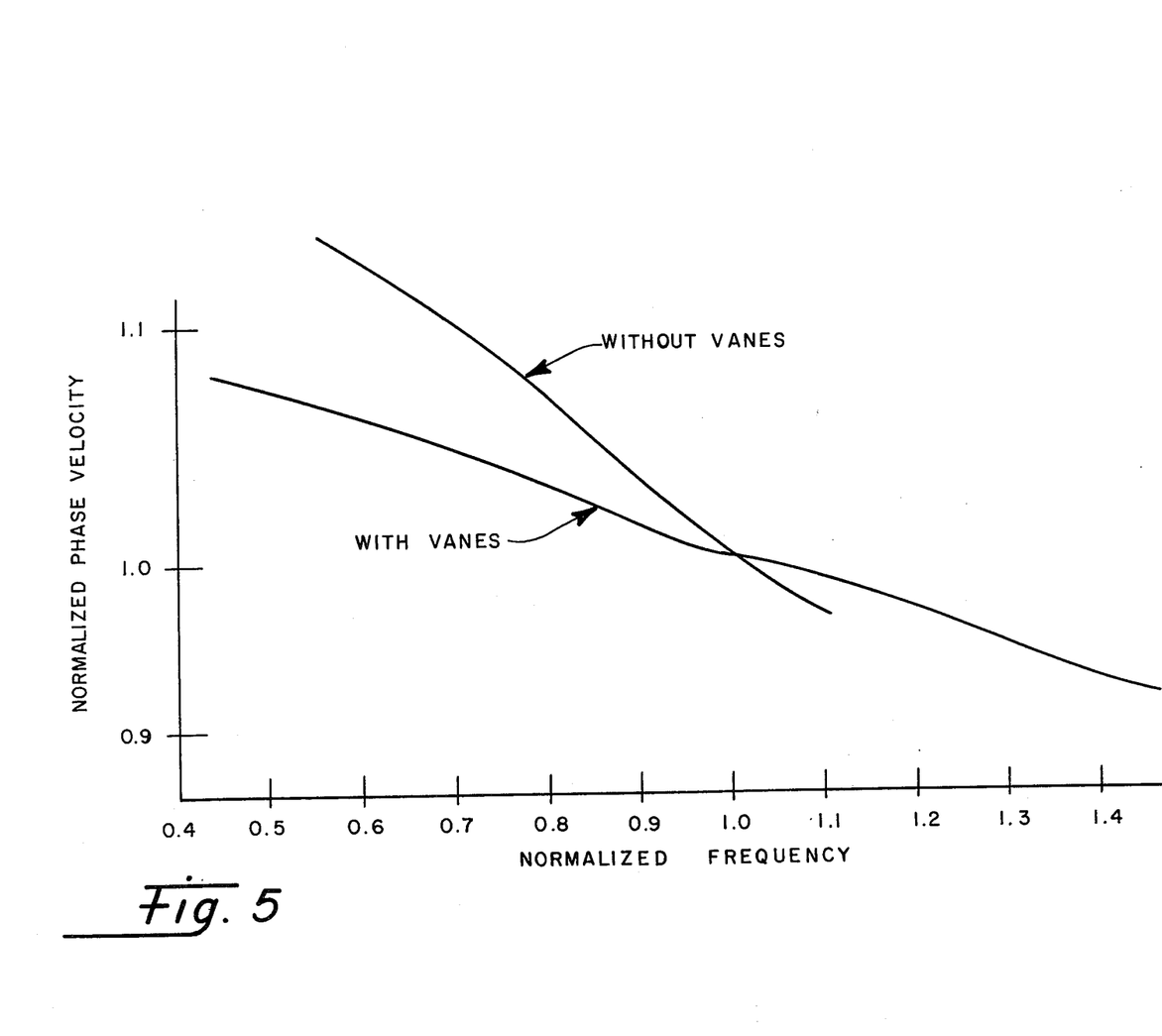
FIG. 5 is a graph of a normalized phase velocity of meander circuits on laser-cutter ladder-shaped substrate.

FIG. 5 shows phase velocity as a function of frequency of a shaped substrate meander circuit with shields and also such a circuit without shields to facilitate comparison; frequencies and phase velocities are normalized with respect to the values corresponding to 90° phase shift per circuit bar. The shields have reduced the slope of the phase velocity curve to less than half that of the circuit without shields, and in principle this corresponds to more than doubling the bandwidth. A measure of dispersion, i.e., rate of variation of phase velocity with frequency is $(V_{ph}/V_g - 1)$ where $V_{ph}$ is phase velocity and $V_g$ is group velocity. At 90° phase shift per bar, this quantity is 0.14 in the circuit with shields and 0.31 in the circuit without shields.

OBJECTIVE

It has been the objective to investigate slow-wave circuits suitable for broad-band dual-mode injected beam crossed-field amplifiers (IBCFA's). Specifically, the purpose has been to provide circuits suitable for instantaneous octave bandwidth, and for 10 dB pulse-up. The primary frequency orientation was toward the 4–8 GHz band, but consideration was also given toward other frequency bands, especially those higher in frequency.

The specific power levels for the 10 dB pulse up were chosen to be 800 W CW and 8 kW pulse.

SELECTION OF BROAD BAND CIRCUIT

Depending on their characteristic applications, many slow wave circuits have been devised and used in crossed-field amplifiers (CFA's). A major difference between circuits for CFA's and for linear beam tubes is that the circuit must present a flat surface, parallel to the magnetic field, to establish the boundary of the electric field. Subject to this constraint, the choice of the slow wave structure to be used for a given application is determined by the characteristic properties of the line, the principal of which are:

(1) The dispersion of the line, which is the primary factor determining bandwidth of the tube.

(2) The thermal dissipation capabilities of the line, determining the maximum power output of the tube. Note that electron interception by the circuit is an intrinsic property of all CFA's.

(3) The coupling impedance to the beam, affecting primarily the efficiency of the tube.

(4) The size and required tolerances, affecting cost, reproducibility and reliability.

The prinicpal limitation on bandwidth is the necessity of maintaining near synchronism between the phase velocity of the circuit and the velocity of the beam. The objective therefore is a slow-wave circuit design capable of maintaining close enough synchronism with the beam at a fixed velocity to cover an octave bandwidth, while satisfying the other criteria listed above.

Space harmonic structures are inherently unsuited for octave bandwidth, since phase shift per bar must be greater than $\pi$ and less than $2\pi$. They also suffer from lower coupling impedance.

The category of circuits of particular interest is derived from the helix in one way or another. All such circuits must be configured to present a flat boundary toward the interaction space. These circuits include the flattened helix and helix-coupled bar (HCB) structures. The meander line, now widely used in broadband Injected Beam Crossed Field Amplifiers (IBCFA's), can be considered as the ultimate flattened helix.

There is a significant body of literature on meander type circuits. The primary bases of theory has been the work of A. Leblond and G. Mounter, Ann. Radioelectricite, Vol. 9, 311, 1954. Also see J. Arnaud, "Theory of Bar Lines", Sec 2.2, Vol. 1, *Crossed-Field Microwave Devices* (E. Okress, ed.) Academic Press, New York, 1961. W. Sobotka, "Le TPOM en regime continu", thesis, University of Paris, 25 June 1970, applies this work to the meander circuit. This work has been amplified further by H. L. McDowell, "Ceramic Mounted Circuit For Crossed-Field Amplifiers", Final Report, contract DAAB07-72-C-0273, Varian Eastern Tube Division, Beverly, MA, for U.S. Army Electronics Command, Ft. Monmouth, N.J. J. Weiss "Dispersion and Field Analysis of a Microstrip Meander-Line Slow Wave Structure", IEEE Transactions on Microwave Theory and Technique, vol. MTT 22, pp. 1194–1201, Dec. 1974, took a somewhat different approach, replacing some of the simplistic assumptions of previous bar line theory.

From the calculations, the allowable range of $c/v_{ph}$ for octave instantaneous bandwidth is 12.5 to 13.1 corresponding to $v_{ph}/v_g$ of 1.08 at 90° phase shift, and to $\gamma_1/\gamma_0$ of 0.04.

Figure 6:
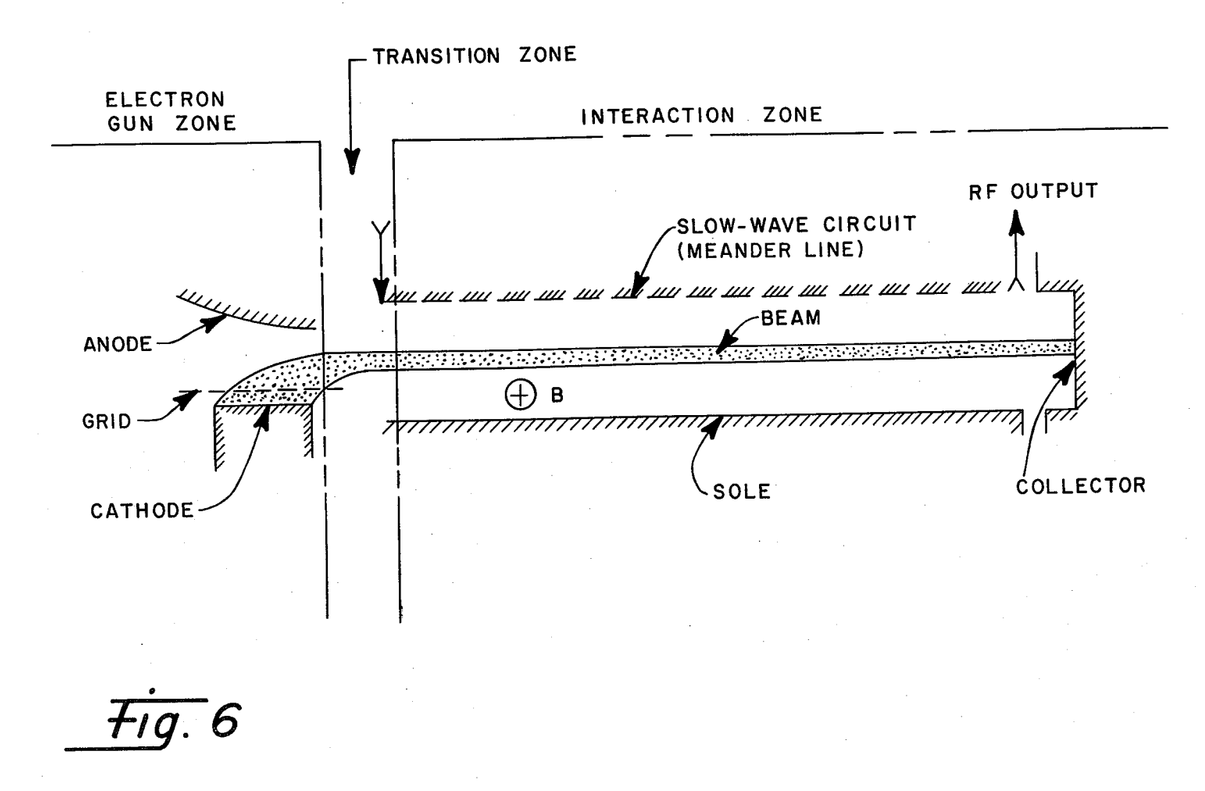
FIG. 6 is a schematic view of an injected-beam crossed field amplifier.

FIG. 6 shows a schematic view of an injected beam crossed-field amplifier which may be used with the slow-wave meander line circuit of FIGS. 3 and 4. A gun design is described by G. Dohler in *Technical Digest of the International Electron Devices Meeting*, December 1974.

From both experimental and theoretical analysis, the following factors lead to reduced dispersion:

(1) Higher vanes
(2) Thinner Meander
(3) Reduced overhang, when ceramic width is fixed.

If the circuit is supported on individual ceramics as shown in FIG. 1 the line advances from one bar to the next are unsupported. If the line is thin, it is vulnerable to burn-out due to electron bombardment at these points.

An alternative concept for supporting the meander was shown in FIG. 2. Here the individual insulators are supported by a single laser-cut substrate bonded to a ground plane which is co-expansive with the ceramic. In this configuration, the line advances are supported by the substrate. The circuit shown in FIG. 2 is made less dispersive by the addition of vanes between the bars of the meander circuit, as shown in FIGS. 3 and 4.

Figure 7:
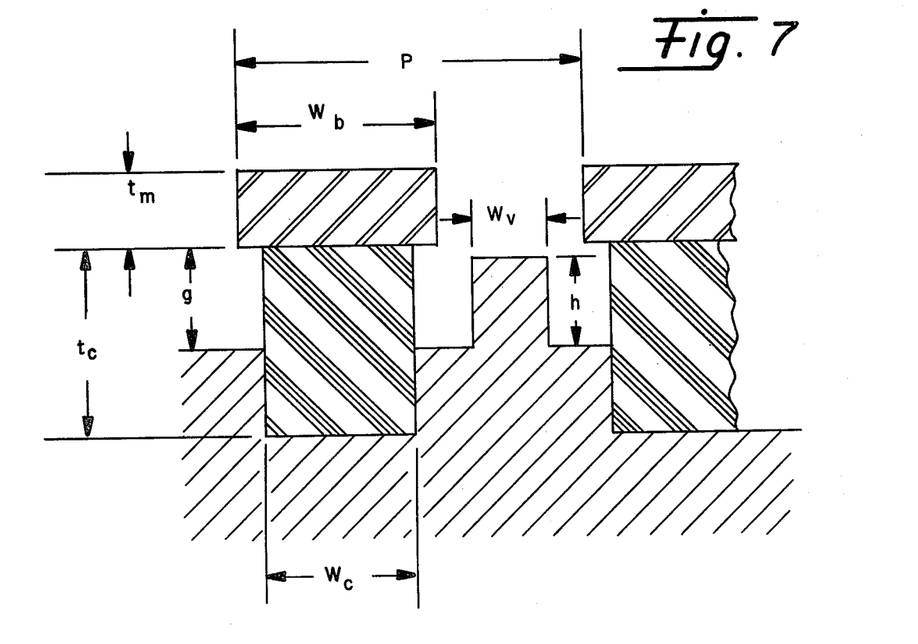
FIG. 7 is a cross-section view of a meander line slow-wave circuit with a dimension key.

The configuration shown in FIGS. 3 and 4 has been chosen as the prime candidate to demonstrate a high performance broad-band circuit. The meander is thin and the edges of the bars are flush with the edges of the ceramic, a condition which also led to reduced dispersion. The dimensions chosen were as follows (see FIG. 7):

| | |
|---|---|
| Pitch (p) | = 0.030" |

-continued

| | |
|---|---|
| Bar Width ($W_b$) | = 0.014" |
| Meander thickness ($t_m$) | = 0.003" |
| Meander to ground plane (g) | = 0.010" |
| Ceramic width ($w_c$) | = 0.014" |
| Ceramic thickness ($t_c$) | = 0.010" |
| Vane width ($w_v$) | = 0.005" |
| Vane height (h) | = 0.009" |
| Ceramic Length (= total width of circuit) | = 0.250" |
| Number of bars | = 53 |

Design calculations based on these quantities predicted $v_{ph}/v_g$ of 1.12 for $\phi=\pi/2$ according to the Weiss dispersion equation, and 1.06 according to Sobotka. From the experiments the expected $v_{ph}/v_g$ would be about 1.09. The calculated attenuation was 0.27 dB per delayed wave length at $\phi=\pi/2$, as compared with 0.26 calculated for a production c-band IBCFA.

Large-signal calculations were performed using the calculated circuit parameters. The predicted instantaneous bandwidth as moderately good, but a little further reduction in dispersion would be desirable for optimum performance at the high end of the band. However, it was decided to use these dimensions because increasing the vane height would lead to much more complicated assembly tooling since the vanes would extend above the top surface of the ceramic substrate. These design dimensions were considered adequate to demonstrate the principle of this new type of broad-band meander circuit. This kind of circuit is assembled in the following steps:

(1) Braze vanes into grooves and make final cut to size.

(2) Metallize ceramic coupon (Ti-Mo-Cu) and photo-etch metallizing to form a meander pattern on one side.

(3) Laser cut ceramic to form ladder-shaped substrate.

(4) Bond substrate to base by copper-to-copper diffusion, with high temperature and pressure.

(5) Add photo-etched meander of desired thickness. Bond by copper-to-copper diffusion.

When the circuit was assembled, some problems were encountered in the registration between the vanes, substrate, and meander. The vanes were off-center with respect to the substrate, and after the meander was attached, there were areas of metallizing which were exposed. Furthermore, the vane height was 0.008" instead of 0.009" as designed. In spite of these dimensional deficiencies, it was possible to make useful measurements.

Figure 8:
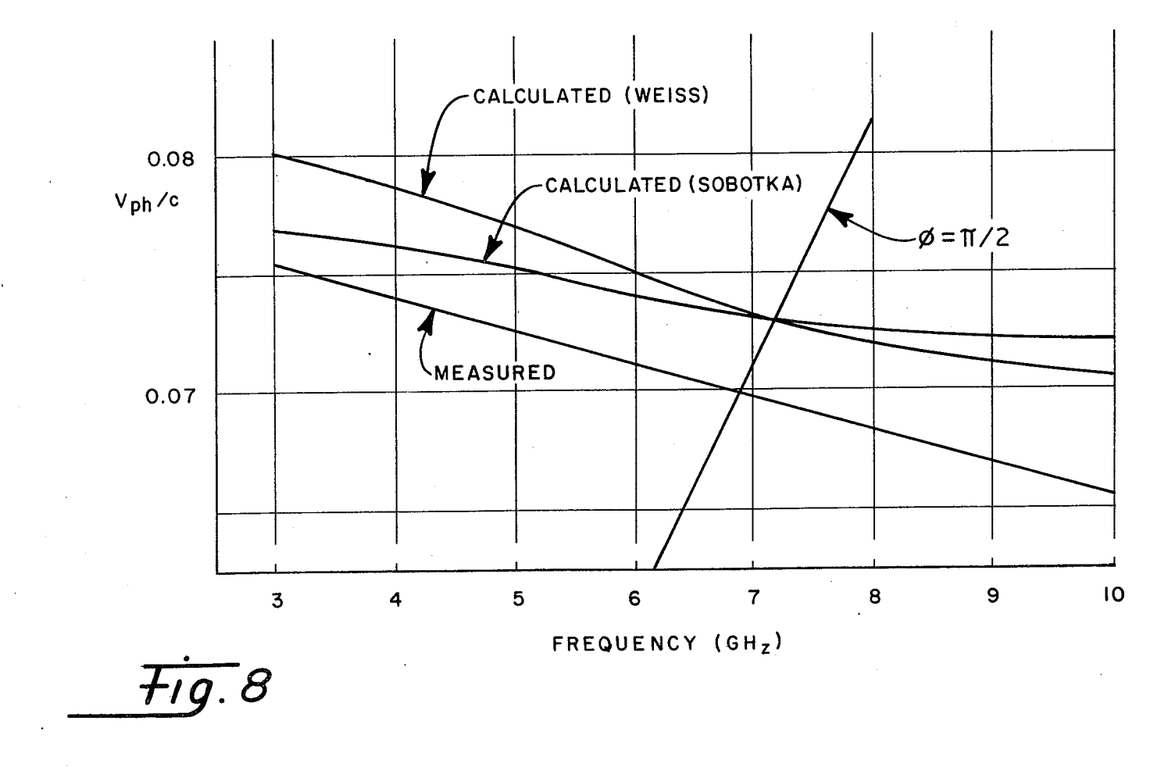
FIG. 8 is a graph showing phase velocity of a G/H-band meander line slow-wave circuit.

FIG. 8 shows phase velocity as a function of frequency, calculated and measured. Measured attenuation increased linearly with frequency from 3.5 dB at 4 GHz to 9 dB at 8 GHz. Calculated attenuation was 2.15 dB at 4 GHz and 3.8 dB at 8 GHz.

The discrepancies between measured values and calculated values are attributed primarily to the dimensional inaccuracies in building this structure. In particular, the areas of exposed metallization, which should have been covered by the photo-etched meander, are believed to have increased the RF losses quite seriously.

SUMMARY AND CONCLUSIONS

The over-all objective was to develop design concepts for an injected-beam crossed-field amplifier (IBCFA) capable of octave instantaneous bandwidth and 10 dB pulse-up. The frequency band selected was 4–8 GHz.

A series of experimental circuits was built to demonstrate the effect of various dimensional changes on circuit dispersion, coupling impedance, and attenuation. Dispersion is reduced, and thus instantaneous bandwidth is increased, by increased vane height between meander bars, by a thinner meander line, and by less overhang of the bars with respect to the supporting ceramics if the dimensions of the ceramic are unchanged. The increased vane height has the disadvantage of reducing the coupling impedance.

Electron gun design and beam injection were reviewed. Some modifications of the electrode shapes as compared with the prior tube were recommended. An improved grid design was proposed which would decrease cathode loading significantly, together with grid control properties as good or better than the existing design.

A meander circuit of final design was built and tested. The design incorporated the experimental and computational results which had been made. Design for stabilization was also analyzed. A laser-cut shaped-substrate configuration was chosen because it allows a thinner meander, because of potential cost saving in assembly, and because of its potential for higher frequency ranges. Test results showed that such an approach is effective for a broad band circuit.

Thus, while preferred constructional features of the invention are embodied in the structure illustrated herein, it is to be understood that changes and variations may be made by the skilled in the art without departing from the spirit and scope of my invention.

I claim:

1. In a meander line slow-wave circuit device comprising a planar assembly including a conductive ground plane, a dielectric substrate contiguous with said ground plane and a serpentine meander line conductor having connecting transverse and longitudual segments disposed on a portion of the upper surface of said substrate, an integral unitary ladder shaped planar dielectric substrate having a plurality of spaced transverse vane segments intersecting a pair of opposing continuous longitudinal vane segments, portions of said longitudinal vane segments between transverse vane segments being exposed when said meander line conductor is disposed thereon, and including a plurality of slot-like openings in the dielectric substrate between adjacent transverse segments of said conductor disposed on said transverse vane segments, the complete lower surface of said intersection longitudinal and transverse vane segments of said substrate being in continuous direct contact with said ground plane;

the improvement comprising a plurality of electrically conductive shields disposed in said slot-like openings between adjacent parallel transverse segments of said meander line conductor and connected to said ground plane to decrease dispersion and increase the bandwidth.

2. The device as defined by claim 1, wherein said meander line conductor is relatively thin and the edges of said transverse segments are substantially flush with the edges of the substrate adjacent said slot-like openings.

3. An injected beam crossed-field amplifier, including the device as defined by claim 1 or 2, said amplifier having an electron gun and an interaction space adjacent said device.

4. The method of making a slow-wave circuit device as defined by claim 1 or 2, comprising the steps:
(a) cutting a series of grooves in said ground plane;
(b) inserting said shields into said grooves, brazing them into place, and then making a final machine cut to size to assure uniform and accurate effective size and position of said vanes;
(c) coating the assembly with a layer of metal to assure good surface conductivity;
(d) cutting said substrate to said ladder configuration;
(e) bonding the substrate to the ground plane; and
(f) bonding said meander line conductor to said substrate.

5. The method according to claim 4, wherein step (d) comprises laser cutting, and wherein the substrate is metalized in the meander configuration by photo etching on the opposite face, to which the meander line conductor is attached.

6. The method according to claim 5, wherein in step (e) the bonding process consists of copper-to-copper diffusion with high temperature and pressure without adding a braze filler so that resistance losses are minimized.

7. The method according to claim 6, wherein the meander line conductor is made by photo-etching.

* * * * *